US 9,253,914 B2

(12) United States Patent
Demange

(10) Patent No.: US 9,253,914 B2
(45) Date of Patent: Feb. 2, 2016

(54) COMPUTER BLADE FOR RACKABLE SERVER

(71) Applicant: BULL SAS, Les Clayes-Sous-Bois (FR)

(72) Inventor: Fabien Demange, Poissy (FR)

(73) Assignee: BULL SAS, Les Clayes Sous Bois (FR)

( * ) Notice: Subject to any disclaimer, the term of this patent is extended or adjusted under 35 U.S.C. 154(b) by 0 days.

(21) Appl. No.: 14/184,314

(22) Filed: Feb. 19, 2014

(65) Prior Publication Data

US 2014/0233182 A1    Aug. 21, 2014

(30) Foreign Application Priority Data

Feb. 20, 2013    (FR) ...................................... 13 51435

(51) Int. Cl.
*G06F 1/16* (2006.01)
*H05K 5/00* (2006.01)
*H05K 7/00* (2006.01)
*H05K 7/14* (2006.01)

(52) U.S. Cl.
CPC ............ *H05K 7/1487* (2013.01); *H05K 7/1409* (2013.01)

(58) Field of Classification Search
CPC .................................................. H05K 7/1487
See application file for complete search history.

(56) References Cited

U.S. PATENT DOCUMENTS

| | | | |
|---|---|---|---|
| 5,873,745 A * | 2/1999 | Duclos et al. ................. | 439/157 |
| 6,185,106 B1 * | 2/2001 | Mueller ......................... | 361/798 |
| 6,288,891 B1 * | 9/2001 | Hasegawa et al. ....... | 361/679.07 |
| 6,315,586 B1 * | 11/2001 | Joyce et al. .................... | 439/157 |
| 6,359,778 B1 * | 3/2002 | Wu ........................... | 361/679.33 |
| 6,406,322 B1 * | 6/2002 | Barringer et al. ............. | 439/377 |
| 6,490,153 B1 * | 12/2002 | Casebolt et al. ......... | 361/679.33 |
| 6,695,520 B1 * | 2/2004 | Sarno et al. ...................... | 403/11 |
| 6,816,382 B2 * | 11/2004 | Barringer et al. ............. | 361/752 |
| 7,438,571 B1 * | 10/2008 | Barina et al. .................. | 439/157 |
| 7,511,953 B2 * | 3/2009 | Tao et al. .................. | 361/679.39 |
| 7,684,208 B2 | 3/2010 | Okamoto et al. | |
| 7,848,096 B2 * | 12/2010 | Peng et al. ............... | 361/679.33 |
| 7,848,099 B1 * | 12/2010 | Zhang et al. ............. | 361/679.38 |
| 8,246,129 B2 * | 8/2012 | Wang et al. ................ | 312/332.1 |
| 8,248,775 B2 * | 8/2012 | Zhang et al. ............. | 361/679.33 |
| 8,300,398 B2 * | 10/2012 | Zhang et al. ............. | 361/679.33 |
| 8,587,957 B2 * | 11/2013 | Shu ............................... | 361/801 |
| 8,749,966 B1 * | 6/2014 | Boudreau et al. ........ | 361/679.33 |
| 8,976,520 B2 * | 3/2015 | Yang et al. ............... | 361/679.37 |
| 2002/0126446 A1 * | 9/2002 | Miyako et al. ................ | 361/683 |
| 2005/0094363 A1 * | 5/2005 | Chen et al. .................... | 361/683 |

(Continued)

FOREIGN PATENT DOCUMENTS

FR    2 779 901    12/1999

*Primary Examiner* — Hoa C Nguyen
*Assistant Examiner* — Xanthia C Cunningham
(74) *Attorney, Agent, or Firm* — Pillsbury Winthrop Shaw Pittman LLP

(57) ABSTRACT

A computer blade for a rackable server includes a chassis that can be inserted into the rackable server along a reference axis, the chassis including two longitudinal faces and at least one transverse face; two lever arms, each lever arm being fixed to the chassis through a pivot link such that each lever arm is capable of pivoting relative to the transverse face between a lock position in which the lever arm extends parallel to the transverse face and a release position in which the lever arm forms an angle from the transverse face, each lever arm including a first end with at least one transverse tab projecting from one of the longitudinal faces of the chassis when the lever arm is in its lock position, the two lever arms being fixed to each other through a sliding pivot link.

17 Claims, 4 Drawing Sheets

(56) References Cited

U.S. PATENT DOCUMENTS

| | | | |
|---|---|---|---|
| 2005/0141192 A1* | 6/2005 | Song | 361/692 |
| 2006/0018105 A1* | 1/2006 | Suzue et al. | 361/798 |
| 2006/0134953 A1* | 6/2006 | Williams et al. | 439/157 |
| 2009/0016012 A1* | 1/2009 | Huang | 361/685 |
| 2011/0095153 A1* | 4/2011 | Zhang et al. | 248/309.1 |
| 2011/0128687 A1* | 6/2011 | Chen et al. | 361/679.02 |

* cited by examiner

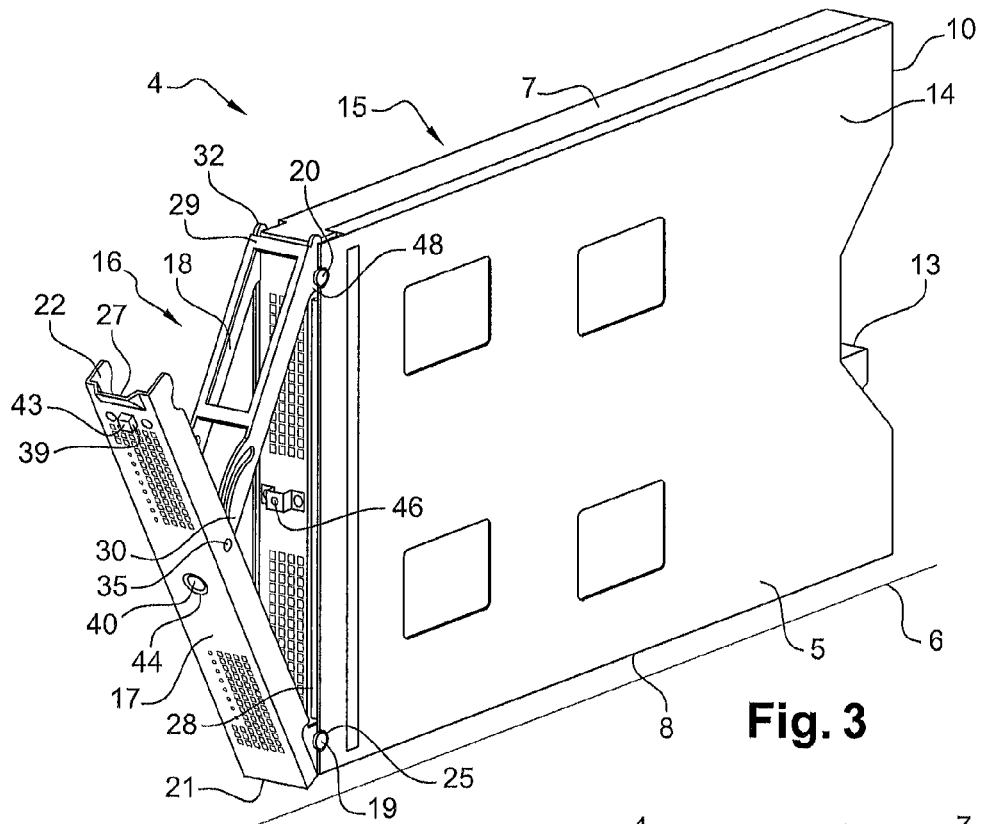
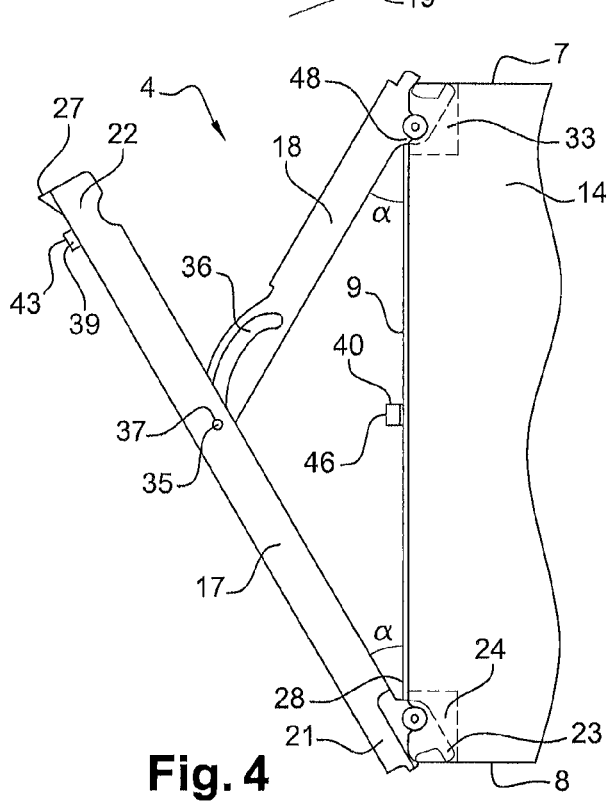 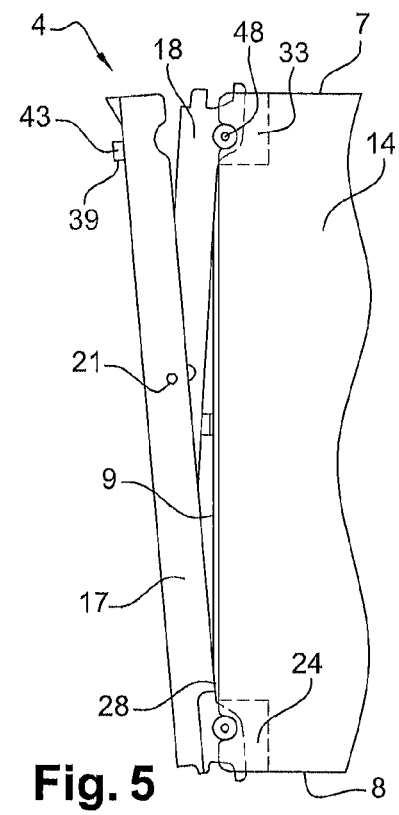
Fig. 3
Fig. 4   Fig. 5

COMPUTER BLADE FOR RACKABLE SERVER

CROSS REFERENCES TO RELATED APPLICATIONS

This application claims priority to French Patent Application No. 1351435, filed Feb. 20, 2013, the entire content of which is incorporated herein by reference in its entirety.

FIELD

This invention relates to a computer blade for rackable server provided with an optimised system for inserting the computer blade into the frame of the rackable server.

BACKGROUND

Rackable servers usually comprise several racks or slots inside which computer blades may be inserted. U.S. Pat. No. 7,684,208 discloses such a rackable server. This rackable server comprises a locking system capable of retaining each computer blade in the rack in which it is inserted. This locking system also comprises a lever that a user can use to handle the computer blade and particularly to insert it into the rack and to remove it. However, the levers according to prior art are incapable of manipulating large or heavy computer blades. In particular, levers according to prior art cannot be used to handle computer blades with a hydraulic cooling system because the connection forces are too high.

Furthermore, when the computer blade is being inserted into the rack in the rackable server, the connectors of the computer blades must be inserted into the sockets of the rackable server. However, levers according to prior art cannot enable correct insertion of the computer blade connectors without the computer blade becoming jammed when the connection force is applied too far from the pivot point of the lever.

SUMMARY

An aspect of the invention is aimed at overcoming the disadvantages of the state of the art by disclosing a manipulation device for manipulating a computer blade making it easy to insert the computer blade into a rackable server and to remove it, even when the computer blade is heavy and/or large, without the computer blade or its manipulating system deforming.

An aspect of the invention also aims at disclosing a system for inserting the computer blade that enables good insertion of the computer blade connectors into the rackable server.

To achieve this, a first aspect of the invention discloses a computer blade for a rackable server comprising:
  a chassis configured to be inserted into the rackable server along a reference axis, the chassis comprising two longitudinal faces and at least one transverse face;
  a manipulation device to manipulate the computer blade, the manipulation device comprising two lever arms, each lever arm being fixed to the chassis through a pivot link such that each lever arm is capable of pivoting relative to the transverse face between a lock position in which the lever arm extends parallel to the transverse face and a release position in which the lever arm forms an angle $\alpha$ from the transverse face, each lever arm comprising a first end with at least one transverse tab projecting from one of the longitudinal faces of the chassis when the lever arm is in its lock position, the two lever arms being fixed to each other by a sliding pivot link.

The fact of having two lever arms connected to each other by a sliding pivot link can give a stronger computer blade manipulating device than prior art. Forces are then distributed on the two lever arms and on their attachment points to the chassis. Since each pivot link comprises two support points on the chassis, the forces from the manipulating device are distributed on four support points of the chassis, which prevents jamming of the computer blade. Furthermore, the fact of having a sliding pivot link between the two lever arms not only reinforces the lever arms and distributes forces over the entire computer blade, but also enables that only one lever arm has to be manipulated to insert or remove the computer blade into or from the rackable server.

Furthermore, the manipulation device enables optimised insertion of the computer blade into the chassis and in particular enable better insertion of the connectors of the computer blade into the corresponding sockets in the chassis. Each of the two lever arms comprises at least one transverse tab projecting from the chassis. The manipulation device is in the release position during insertion of the blade, and the lever arms are put into the lock position when the tabs of the lever arms are facing the corresponding notches in the rackable server, such that the tabs penetrate into the corresponding notches in the rackable server and apply a force on the computer blade due to a lever effect that facilitates insertion of the connectors of the computer blade into the corresponding sockets in the rackable server. Conversely, when the blade has to be removed from the rackable server and the lever arms are put into the release position, the tabs apply a force in the opposite direction on the walls of the notches of the rackable server to facilitate removal of the computer blade from the rackable server.

The computer blade according to an embodiment of the invention may also comprise one or several of the characteristics mentioned below, independently or in any technically possible combination.

In an embodiment, the sliding pivot link is arranged such that the angle $\alpha$ formed between one of the lever arms and the transverse face is always equal to the angle $\alpha$ formed between the other lever arm and the transverse face. The fact that these two angles are equal prevents any jamming effect and guarantees perfect insertion of all connectors regardless of their position over the height of the computer blade or their required connection force.

Beneficially, the sliding pivot link is formed by:
  a curved groove formed in one of the lever arms and
  a pivot fixed to the other lever arm, the pivot being capable of sliding in the curved groove, the curved groove having a form arranged such that the angle formed between one of the lever arms and the transverse face is always equal to the angle formed between the other lever arm and the transverse face.

Beneficially, the angle $\alpha$ varies between 0° and 30°. This angle is sufficient to release the tabs from the orifices of the rackable server.

In an embodiment, the lever arms are fixed to the transverse face of the chassis of the computer blade.

Beneficially, the transverse face comprises two ends, each lever arm being fixed at one of the ends of the transverse face. Thus, connection and insertion forces are distributed over the entire height of the blade.

According to an embodiment, one of the lever arms, referred to as the "first lever arm", comprises a free end, the other of the lever arms, referred to as the "second lever arm", comprises an end fixed to the first lever arm through the sliding pivot link. Thus, simply pull or push the first lever arm enables to lock or release the manipulation device. Manipulation of the computer blade is thus facilitated despite the presence of two lever arms.

Beneficially, openings are formed through each lever arm. These openings allow ventilation air to penetrate into the computer blade despite the presence of the lever arms on the transverse face of the chassis.

Beneficially, the computer blade also comprises a first securing device or retainer capable of retaining the lever arms in the lock position. These first securing devices prevent the computer blade from accidentally coming out of the rackable server. In an embodiment, this is done by providing the first securing device with:
- A flexible hook fixed on the transverse face of the chassis
- A reception part in which the hook fits, together with a push button on the first lever arm.

In an embodiment, a hook made of flexible material for example such as spring steel plate, is fixed onto the transverse face of the chassis. A part in which the hook fits, fixed on the first lever arm, locks into the previous hook when the lever arms are in the lock position. A button is also fixed onto the first arm such that when pressure is applied, it lifts the flexible hook from the transverse face of the chassis by passing through an orifice in the part into which the hook fits and releases the lever arms.

Beneficially, the computer blade also comprises a second securing device or retainer capable of retaining the lever arms in the lock position. These second securing devices prevent the lever arms from pivoting relative to the transverse face thus releasing the computer blade from the rackable server, if a user accidentally presses the button of the first securing device. In an embodiment, this is done by providing the second securing device with a screw that passes through an orifice in the first lever arm and that can be screwed in an orifice of the transverse face of the chassis. When the screw is screwed into the orifice of the transverse face of the chassis, it retains the first lever arm in the lock position.

A second aspect of the invention also relates to a rackable server comprising a frame in which a computer blade according to the first aspect of the invention can be inserted, the frame comprising notches into which the tabs of each of the lever arms of the computer blade will fit.

BRIEF DESCRIPTION OF THE FIGURES

Other characteristics and benefits of the invention will become clear after reading the following detailed description with reference to the appended figures that show:

FIG. 3, a perspective view of a computer blade according to an embodiment of the invention;

FIG. 4, a side view of the computer blade in FIG. 3 in the released position;

FIG. 5, a side view of a computer blade in FIG. 3 during locking;

Identical or similar elements are identified by identical reference symbols in all figures.

DETAILED DESCRIPTION

Figure 1:
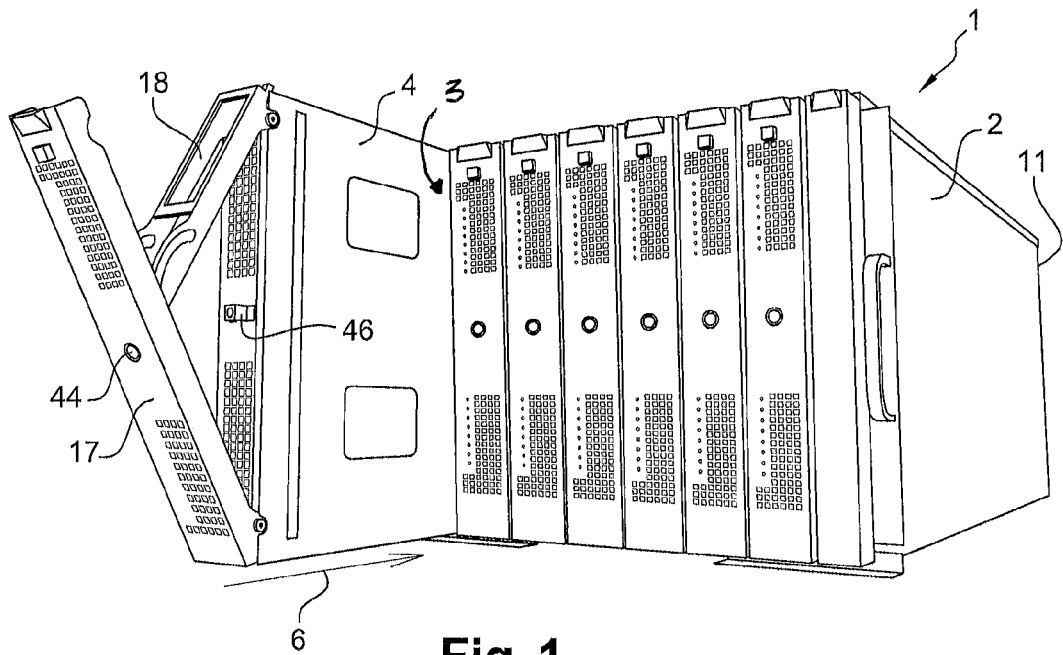
FIG. 1, a perspective view of a rackable server according to an embodiment of the invention.
Figure 2:
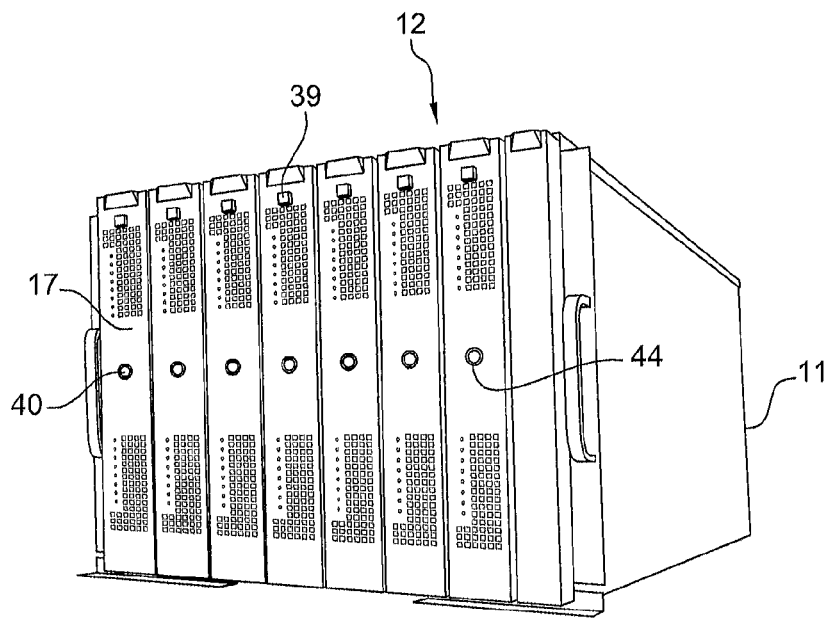
FIG. 2, a perspective view of the server in FIG. 1 during insertion of a computer blade.
Figures 6, 7, 8:
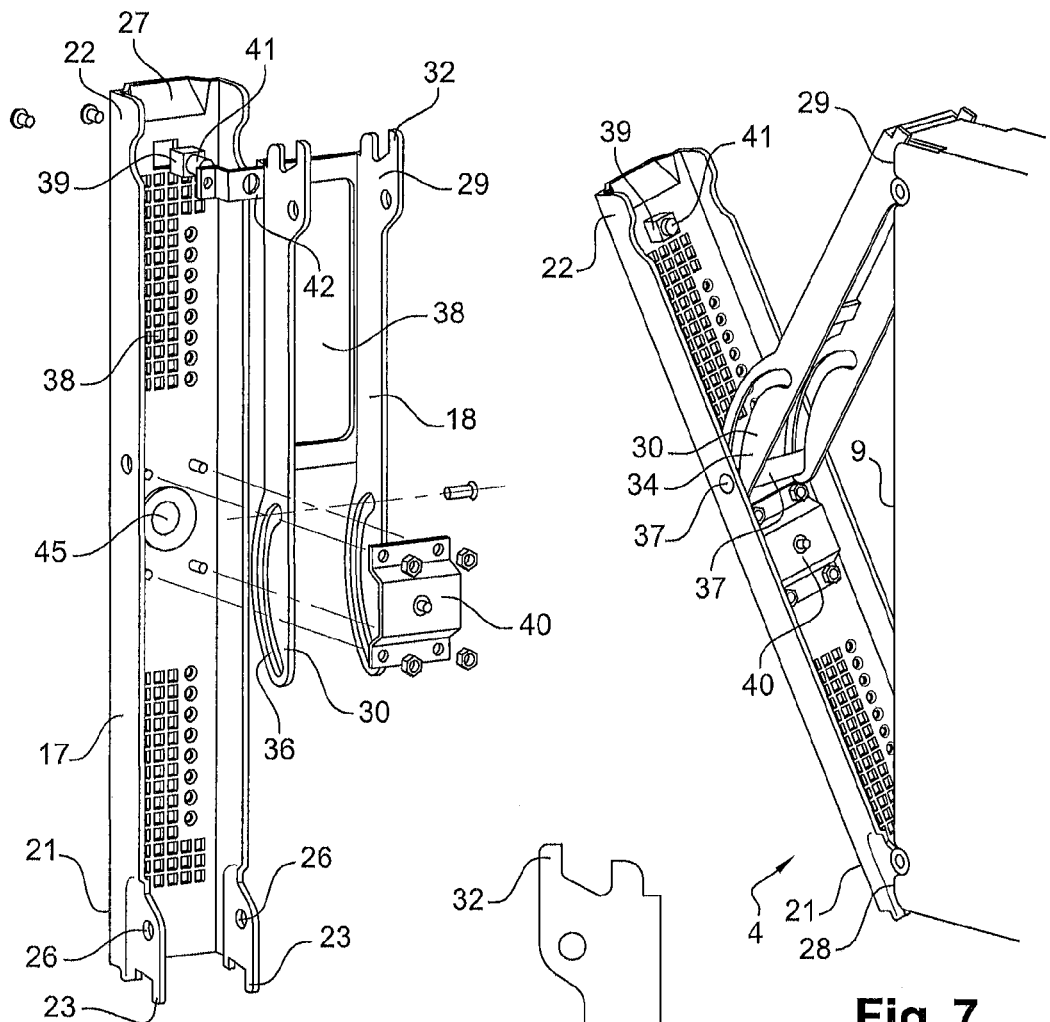
FIG. 6, a perspective view of the lever arms of the computer blade in FIG. 3.
FIG. 7, a perspective view of the computer blade in FIG. 3.
FIG. 8, a side view of one of the lever arms of the computer blade in FIG. 8.

FIGS. 1 and 2 show a rackable server 1 according to an embodiment of the invention. This server 1 comprises a frame 2 itself comprising several racks 3 inside which computer blades 4 may be inserted. The frame 2 comprises a back panel 11 on which sockets are located inside which computer blade connectors can be inserted. The frame also comprises an opening 12 through which the computer blades 4 are inserted.

A computer blade 4 is shown more precisely in FIGS. 3 to 8, This computer blade 4 comprises a chassis 5. This chassis 5 usually comprises an electronic board and electronic components (not shown), and a hydraulic cooling system.

The computer blade 4 lies along a reference axis 6. This reference axis is the direction along which the computer blade is inserted into the rackable server.

The chassis 5 comprises:
- two longitudinal faces 7, 8 extending along the reference axis 6;
- one transverse face 9 extending perpendicular to the two longitudinal faces 7, 8. When the computer blade 4 is inserted into the frame 2, the transverse face 9 is located on the side of the opening 12 of the frame 2;
- one connection face 10 extending perpendicular to the two longitudinal faces 7, 8. Connectors 13 pass through the connection face 10 and are configured to be inserted into the sockets in the frame 2. Therefore when the computer blade 4 is inserted into the frame 2, the connection face 10 is located on the side of the back panel 11 of the frame 2;
- two side walls 14, 15 extending along the reference axis 6.

The computer blade 4 also comprises a manipulation device 16 that a user can use to insert and remove the computer blade 4 into and from the frame 2. The manipulation device comprises:
- A first lever arm 17 fixed to the chassis 5 through a pivot link 19;
- A second lever arm 18 fixed to the chassis 5 through a pivot link 20.

Each lever arm 17, 18 can pivot about its pivot link between:
- A lock position (FIG. 2) in which the lever arm is parallel to the transverse face 9;
- A released position (FIG. 1) in which the lever arm forms a non-zero angle α with the transverse face 9.

The two lever arms 17, 18 are connected together by a sliding pivot link 35 such that the angle α formed between the lever arm 17 and the transverse face 9 is equal to the angle α formed between the other lever arm 18 and the transverse face 9.

More precisely, the first lever arm 17 extends over the entire height of the transverse face 9. The first lever arm 17 comprises a first end 21 and a second end 22. The first end 21 is fixed on the transverse face 9 through a pivot link 19. More precisely, in an embodiment, the first end 21 of the first lever arm is fixed close to a first end 28 of the transverse face 9. In an embodiment, the pivot link 21 is formed by a pivot 25 fixed to the transverse face 9 and inserted in two orifices 26 of the first lever arm.

The first end 21 is also provided with four tabs 23 arranged to project transversely from the longitudinal face 8 when the first lever arm 17 is in the lock position. The tabs 23 are also arranged so that they no longer project transversely from the longitudinal face 8 when the first lever arm is in the unlocked position. The computer blade also comprises two recesses 24 into which tabs 23 of the first lever arm 17 can fit when the lever arm is in the released position.

The second end 22 of the first lever arm 17 is free and has a location 27 into which a user can insert his finger.

The second lever arm 18 also comprises a first end 29 and a second end 30. The first end 29 of the second lever arm 18 is fixed to the transverse face 9 through a. pivot link 20. More precisely, in an embodiment, this first end 29 of the second lever arm 18 is fixed to the opposite end 48 of the transverse face 9 on which the first end 21 of the first lever arm 17 is fixed. The pivot link between the second lever arm 18 and the transverse face 9 is similar to the pivot link between the first lever arm 17 and the transverse face 9. Furthermore, the second lever arm also comprises four tabs 32 at its first end 29, like the first lever arm 17. These tabs 32 project transversely from the longitudinal face 7 when the second lever arm 18 is in the lock position. The chassis 5 also comprises two recesses 33 formed to hold each tab 32 when the second lever arm 18 is not in the lock position.

Figure 9A:
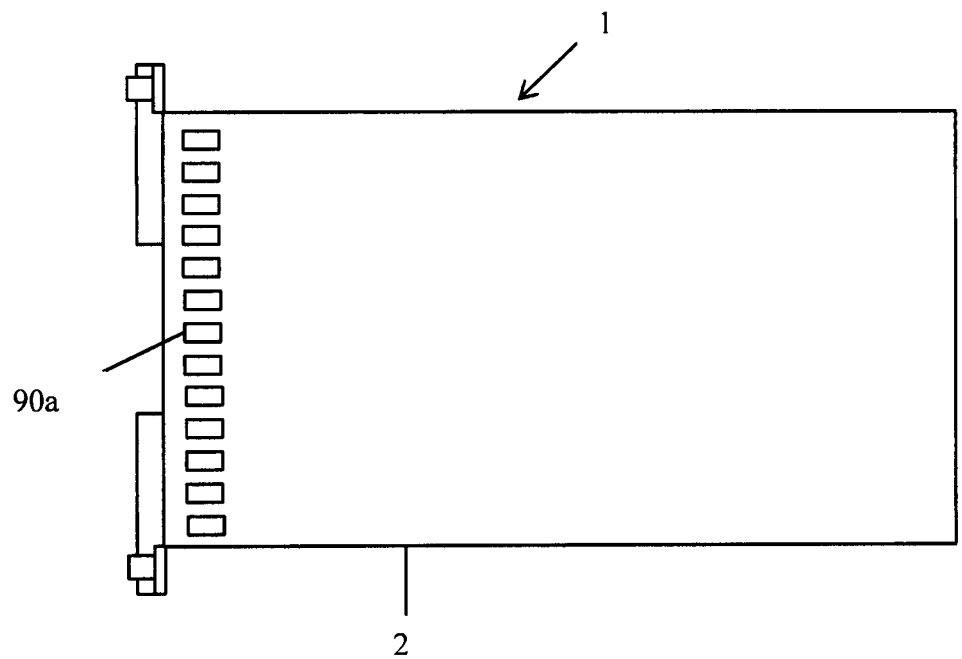
FIG. 9A, a schematic top view of the rackable server of FIG. 1.
Figure 9B:
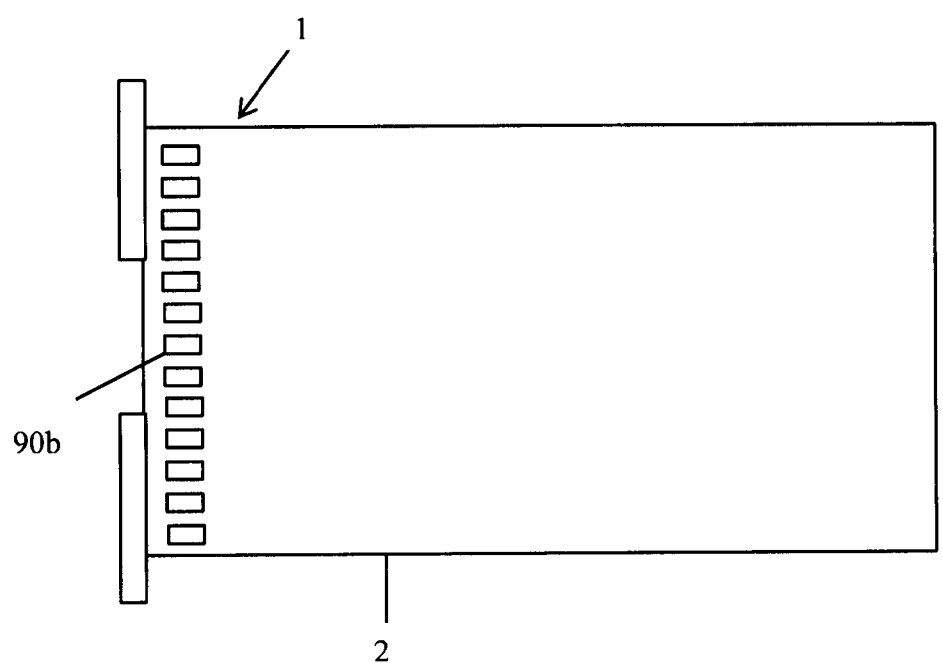
FIG. 9B, a schematic bottom view of the rackable server of FIG. 1.

The tabs 23 and 32 are arranged to penetrate into notches 90a (see FIG. 9A showing a top view of the frame 2) and 90b (see FIG. 9B showing a bottom view of the frame 2) in the frame 2 when the computer blade is inserted into the frame 2. Thus, the tabs 23, 32 facilitate insertion of the computer blade into the frame 2 and insertion of computer blade connectors into the sockets in the frame 2. The tabs 23, 32 apply a lever effect as they penetrate into the notches, such that they pull the computer blade towards the bottom of the frame when the first lever arm is tilted from an angle α equal to an angle α equal to 0°. Conversely, the tabs 23, 32 apply a lever effect in the opposite direction when the first lever arm 18 is tilted from an angle α equal to 0° to an angle α equal to 30° such that they facilitate removal of the computer blade from the frame.

The second end 34 of the second lever arm 18 is not free but it is fixed onto the first lever arm 17 through a sliding pivot link 35. More precisely, the second end 34 of the second lever arm is fixed onto the first lever arm at a point at a distance from the second end 22 of the first lever arm equal to the length of the first lever arm.

The sliding pivot link 35 is formed by a curved groove 36 formed in the second lever arm 18 and by a pivot 37 fixed to the first lever arm, that slides in the curved groove 36. The shape of the curved groove 36 is chosen such that the angle α between the first lever arm 17 and the transverse face 9 is always equal to the angle α between the second lever arm 18 and the transverse face 9. Thus in this embodiment, the coordinates of the curved groove are:

$$X=10(1-2\sin^2(\alpha))+\sin(\alpha)(311.4\cos(\alpha)-259.6)$$

$$Y=-155.7(1-2\sin^2(\alpha))+\cos(\alpha)(20\sin(\alpha)+259.6)$$

The curved groove 36 is also sized to enable the angle α to vary between 0 and 30°.

In an embodiment, the computer blade also comprises first and second securing devices or retainers 39, 40.

The first securing device 39 holds the lever arms 17, 18 in the lock position. To achieve this, in an embodiment, the first securing device 39 comprises:

A part 41 for holding the hook 42, fixed onto the first lever arm 17,

A flexible hook 42 fixed onto the transverse face 9 of the chassis 5.

The securing device also comprises a button 43 that penetrates into the orifice of the part 41 to lift the hook 42. Thus, when the lever arms 17, 18 are in the lock position, is the hook 42 blocks the receiving part 41. The button 43 is in the extended position. Pressing button 43 makes the button slide through a receiving orifice in the part 41 to lift the hook 42, so that the hook 41 is released from the receiving orifice 42 and the lever arms 17, 18 are free to pivot relative to the transverse face 9.

The computer blade also comprises a second securing device or retainer 40 capable of holding the lever arms 17, 18 in the lock position. The second securing device 40 prevents the lever arms 17, 18 from pivoting relative to the transverse face 9 and thus releasing the computer blade 4 from the frame 2 of the rackable server 1, if a user accidentally presses the button 43 of the first securing device 39. In an embodiment, this is achieved by the second securing device 40 having a screw 44 that passes through an orifice 45 in the first lever arm 17 and that can be screwed in an orifice 46 of the transverse face 9 of the chassis. When the screw 44 is screwed into the orifice 46 of the transverse face 9 of the chassis, it holds the first lever arm 17 in the lock position. Furthermore, since the second lever arm 18 is located between the first lever arm 17 and the transverse face 9, the second lever arm 18 is also held in the lock position.

Furthermore, in an embodiment, orifices 38 are formed through the two lever arms so that air can pass through each lever arm. There may be many small orifices 38 in the first lever arm to allow air to pass through while hiding the second lever arm and the transverse face 9 for aesthetic reasons. The orifices 38 of the second lever arm may be larger to allow more air to pass and because the second lever arm does not perform any aesthetic role.

Naturally, the invention is not restricted to the embodiments described with reference to the figures and variants could be envisaged without going outside the scope of the invention. It will be appreciated that the sliding pivot link could be formed by a groove on the first lever arm and a pivot fixed onto the second lever arm instead of having the groove on the second lever arm and the pivot fixed onto the first lever arm. Furthermore, each end of each lever arm could have two tabs only instead of four, or even a single tab. It would also be possible to envisage tabs with other shapes; for example in the shape of hooks.

The invention claimed is:

1. A computer blade for a rackable server comprising:
   a chassis configured to be inserted into the rackable server along a reference axis, the chassis comprising two longitudinal faces and at least one transverse face;
   a manipulation device comprising two lever arms, each lever arm being fixed to the chassis through a pivot link such that each lever arm is capable of pivoting relative to the transverse face between a lock position in which said lever arm extends parallel to the transverse face and a release position in which said lever arm forms an angle from the transverse face, each lever arm comprising a first end with at least one transverse tab projecting from one of the longitudinal faces of the chassis when said lever arm is in its lock position, the two lever arms being fixed to each other through a sliding pivot link,
   wherein the sliding pivot link is arranged such that the angle formed between one of the lever arms and the transverse face is always equal to the angle formed between the other lever arm and the transverse face.

2. The computer blade according to claim 1, wherein the transverse face comprises two ends, each lever arm being fixed at one of the ends of the transverse face.

3. The computer blade according to claim 1, wherein one of the lever arms comprises a free end, the other of the lever arms comprises an end fixed to said one of the lever arms through the sliding pivot link.

4. The computer blade according to claim 1, wherein openings are formed through each lever arm.

5. The computer blade according to claim 1, further comprising a first securing device constructed to retain the lever arms in the lock position.

6. The computer blade according to claim 1, further comprising a second securing device constructed to retain the lever arms in the lock position.

7. A rackable server comprising a frame in which a computer blade according to claim 1 is insertable, the frame comprising notches into which the tabs of each of the lever arms of the computer blade are able to be fit.

8. A computer blade for a rackable server comprising:
a chassis configured to be inserted into the rackable server along a reference axis, the chassis comprising two longitudinal faces and at least one transverse face;
a manipulation device comprising two lever arms, each lever arm being fixed to the chassis through a pivot link such that each lever arm is capable of pivoting relative to the transverse face between a lock position in which said lever arm extends parallel to the transverse face and a release position in which said lever arm forms an angle from the transverse face, each lever arm comprising a first end with at least one transverse tab projecting from one of the longitudinal faces of the chassis when said lever arm is in its lock position, the two lever arms being fixed to each other through a sliding pivot link,
wherein one of the lever arms comprises a free end, the other of the lever arms comprises an end fixed to said one of the lever arms through the sliding pivot link, and
wherein the sliding pivot link is formed by:
a curved groove formed in said other of the lever arms, and
a pivot fixed to said one of the lever arms, the pivot being capable of sliding in the curved groove, the shape of the curved groove being chosen such that the angle between said one of the lever arms and the transverse face is always equal to the angle formed between said one of the other lever arms and the transverse face.

9. The computer blade according to claim 8, wherein the transverse face comprises two ends, each lever arm being fixed at one of the ends of the transverse face.

10. The computer blade according to claim 8, wherein openings are formed through each lever arm.

11. The computer blade according to claim 8, further comprising a first securing device constructed to retain the lever arms in the lock position.

12. The computer blade according to claim 8, further comprising a second securing device constructed to retain the lever arms in the lock position.

13. A computer blade for a rackable server comprising:
a chassis configured to be inserted into the rackable server along a reference axis, the chassis comprising two longitudinal faces and at least one transverse face;
a manipulation device comprising two lever arms, each lever arm being fixed to the chassis through a Divot link such that each lever arm is capable of pivoting relative to the transverse face between a lock position in which said lever arm extends parallel to the transverse face and a release position in which said lever arm forms an angle from the transverse face, each lever arm comprising a first end with at least one transverse tab projecting from one of the longitudinal faces of the chassis when said lever arm is in its lock position, the two lever arms being fixed to each other through a sliding pivot link,
wherein one of the lever arms comprises a free end, the other of the lever arms comprises an end fixed to said one of the lever arms through the sliding pivot link,
wherein the sliding pivot link is formed by:
a curved groove formed in said other of the lever arms, and
a pivot fixed to said one of the lever arms, the pivot being capable of sliding in the curved groove, the shape of the curved groove being chosen such that the angle between said one of the lever arms and the transverse face is always equal to the angle formed between said one of the other lever arms and the transverse face, and
wherein the angle varies between 0° and 30°.

14. The computer blade according to claim 13, wherein the transverse face comprises two ends, each lever arm being fixed at one of the ends of the transverse face.

15. The computer blade according to claim 13, wherein openings are formed through each lever arm.

16. The computer blade according to claim 13, further comprising a first securing device constructed to retain the lever arms in the lock position.

17. The computer blade according to claim 13, further comprising a second securing device constructed to retain the lever arms in the lock position.

* * * * *